(12) United States Patent
Staubach et al.

(10) Patent No.: US 6,562,289 B1
(45) Date of Patent: May 13, 2003

(54) METHOD FOR IMPROVING THE CORROSION PROTECTION OF PERMANENT MAGNETS CONTAINING RARE EARTH METALS

(75) Inventors: Harald Staubach, Alzenau (DE); Lothar Zapf, Alzenau (DE)

(73) Assignee: Vacuumschmelze GmbH, Hanau (DE)

( * ) Notice: Subject to any disclaimer, the term of this patent is extended or adjusted under 35 U.S.C. 154(b) by 0 days.

(21) Appl. No.: 09/743,683

(22) PCT Filed: Jul. 2, 1999

(86) PCT No.: PCT/DE99/02045

§ 371 (c)(1),
(2), (4) Date: Feb. 19, 2001

(87) PCT Pub. No.: WO00/04201

PCT Pub. Date: Jan. 27, 2000

(30) Foreign Application Priority Data

Jul. 17, 1998 (DE) .......................................... 198 32 299

(51) Int. Cl.⁷ ................................................. B22F 3/24
(52) U.S. Cl. ........................................... 419/26; 419/29
(58) Field of Search ...................................... 419/26, 29

(56) References Cited

U.S. PATENT DOCUMENTS

| 4,837,114 A | | 6/1989 | Hamada et al. | |
| 4,876,305 A | * | 10/1989 | Mazany | ....................... 524/401 |
| 5,154,978 A | * | 10/1992 | Nakayama et al. | ......... 428/469 |
| 5,275,891 A | | 1/1994 | Tagaya et al. | |
| 5,780,164 A | * | 7/1998 | Pyzik et al. | .............. 428/539.5 |
| 5,840,375 A | * | 11/1998 | Katsumi et al. | ............ 427/600 |
| 6,106,894 A | * | 8/2000 | Zapf | ........................... 427/127 |
| 6,368,517 B1 | * | 4/2002 | Hwang et al. | ................. 216/67 |

FOREIGN PATENT DOCUMENTS

| DE | 3902480 | 9/1989 |
| DE | 19608731 | 9/1997 |
| EP | 0190461 | 8/1986 |
| EP | 0345092 | 12/1989 |
| EP | 0430198 | 6/1991 |
| EP | 0794268 | 9/1997 |
| GB | 2262288 | 6/1993 |

OTHER PUBLICATIONS

"Pretreatment Process for Organic Coating or Neodymium–Iron–Boron Magnets," IBM Technical Bulletin, Bd. 32, Nr. 9A.

* cited by examiner

*Primary Examiner*—Daniel J. Jenkins
(74) *Attorney, Agent, or Firm*—Dean W. Russell; Kilpatrick Stockton LLP

(57) ABSTRACT

The invention relates to a method for producing a sintered material offering improved corrosion protection by activation and coating of the surface with a metal, followed by a heat treatment. Said method is characterized in that during activation and before coating with said metal the following steps are carried out: removal of particles adhering to the surface of the sintered material by treating said surface with a stripper; passivation of the surface; and drying of the sintered material. The invention also relates to a magnetic body with greater corrosion resistance.

9 Claims, No Drawings

METHOD FOR IMPROVING THE CORROSION PROTECTION OF PERMANENT MAGNETS CONTAINING RARE EARTH METALS

The invention relates to a method for producing a sintered material such as a magnetic body offering improved corrosion protection by coating the surface with a metal followed by a heat treatment. The invention also relates to a magnetic body containing rare earth metals with a corrosion-inhibiting coating consisting of a metal.

Magnets containing rare earth metals such as Nd—Fe—B magnets are coated with a metal in order to prevent or limit corrosion. Whereas in the past lacquers were applied to the metal to reduce corrosion, today the widely preferred method for limiting corrosion is the use of a metal coating based on nickel, tin, cadmium or aluminum.

It has been shown that in many applications adequate corrosion protection for Nd—Fe—B magnets in conditions of salt-laden air or high relative humidity can be provided by a metal coating based on aluminum.

For example a method for coating Nd—Fe—B magnets with aluminum utilizing the IVD (ion vapor deposition) process is known from the Proceedings of the Modern Magnetic Materials Conference, London, Jun. 20–21, 1989, pages 8.2 to 8.2.8. According to this publication the magnets are first cleaned by sand-blasting and then bombarded with argon ions in the vacuum chamber utilized in the IVD process. This procedure improves the adhesion of the IVD aluminum to the surface, thus enhancing the corrosion resistance of the magnet.

Another method for coating Nd—Fe—B magnets with aluminum is known from EP-A-O 794268. According to this document the corrosion resistance can be further improved by following the process described above with heat treatment at a temperature of at least 400° C. Magnets produced by this method exhibit 100 hours corrosion resistance according to HAST (highly accelerated steam test) conditions at 130° C. and a pressure of 2.7 bar.

Although the method described above does yield adequate corrosion resistance for permanent magnets for many applications, it still does not deliver sufficient corrosion resistance particularly for permanent magnets subject to high thermal or chemical stress or aggressive conditions. There remains a need, therefore, for further improvement of the corrosion resistance of permanent magnets containing rare earth metals.

Thus the goal of the present invention is to make a method available for producing coated magnetic bodies that display improved corrosion resistance in comparison to conventional magnetic bodies.

A further goal of the invention is to present a method for coating that dispenses with the need for treating the surface of the permanent magnet by means of mechanical abrasion, such as blasting with sand or corundum, prior to application of the metal coating.

These invention goals are achieved through a method for producing a sintered material with improved corrosion resistance by activating the surface and subsequently coating it with a metal followed by a heat treatment, specially characterized in that during activation prior to coating of the surface the following steps are performed:

removal of particles adhering to the surface of the sintered material by treating the surface with a stripper;
passivation of the surface by means of at least one step from the group
(a) treating the surface with hydrophilic solvent,
(b) treating the surface with phosphating solution,
(c) treating the surface with chromating solution,
(d) treating the surface with dewatering fluid or
(e) heat-treating the sintered material and
drying the sintered material.

According to the invention, a stripper is applied to the surface to remove undesired particles (such as oxides or magnetized dust) adhering to the surface of the sintered material, such particles having been shown drastically to reduce the adhesion of the anti-corrosion coating and its corrosion-protecting properties. This method of pre-treating the surface prior to coating yields improved corrosion resistance results. There is generally no need to carry out other, conventional methods of surface activation. Thus the use of a device for mechanical abrasion, such as blasting with sand or corundum, in order to activate the sintered material or to remove impurities prior to coating can preferably be avoided altogether.

The impurities mentioned above are understood to include particles of dirt, oxides or other material on the surface of the sintered body that can degrade the adhesion or corrosion resistance of the magnetic body.

According to the invention the surface is activated by stripping, passivation and drying. The stripper utilized for removing adhering particles preferably contains acid.

Should acid be used as the stripper, it should preferably be an acid that is available in aqueous solution. Suitable acids include for example nitric acid, nitrous acids, peroxide-sulfuric acid, or peroxide-nitric acid blends. Particularly preferred as stripper is a solution with acid content in a range from 0.2 to 25 weight percent, more particularly 1 to 15 weight percent. Most especially preferred as stripper is nitric acid in 8 to 15 percent aqueous solution.

Prior to stripping the sintered material can be cleaned in conventional fashion for example by pre-cleaning in an ultrasonic bath with an appropriate degreasing cleaning fluid. The pre-cleaning is usefully performed at elevated temperature, for example in a boiling degreasing fluid. After pre-cleaning and/or after stripping, an additional cleaning stage is preferred, for example by rinsing with water.

According to the invention passivation of the sintered material is carried out by means of at least one of the steps
(a) treating the surface with hydrophilic solvent,
(b) treating the surface with phosphating solution,
(c) treating the surface with chromating solution,
(d) treating the surface with dewatering fluid or
(e) heat-treating the sintered material.

Examples of hydrophilic or water-mixable solvents are alcohols, γ-butyrolactone, acetone, glycol ether alcohols and n-methyl pyrolidone.

An example of a phosphating solution is Granodine® 20 from Henkel Corp.

An example of a chromating solution is Immunox® Zn Yellow from Blasberg Corp.

Dewatering fluids as such are known and function according to the principle of hydraulic displacement. An example of a dewatering fluid is a mineral oil or hydrocarbon mixture with water-displacing properties, such as Safecoat® from Castrol Corp.

If the surface is chemically passivated, for example by chromating or phosphating, passivation is preferably followed by a water rinse stage.

Subsequent to passivation the sintered material is dried. Drying follows preferably immediately after the passivation stage.

The sintered material can be dried in conventional fashion, for example by drying with hot air, under vacuum or in a centrifuge.

After the surface of the sintered material has been dried, a metal coating is applied to the surface in conventional fashion. In this context it is extremely surprising that a sintered body pre-treated prior to coating according to the invention can be stored for long periods, for example for several weeks, with no degradation of corrosion resistance.

The metal coating is applied preferably by means of a physical vapor deposition (PVD) method, in particular ion vapor deposition (IVD).

IVD coating methods are known for example from the Proceedings of the Modern Magnetic Materials Conference, London, Jun. 20–21, 1989, pages 8.2 to 8.2.8, and from EP-A-O 794268.

During the IVD process the sintered body is generally cleaned immediately prior to being coated by means of ionized argon in the vacuum chamber utilized for applying the coat. The metal to be deposited is then continuously vaporized inside the chamber.

Surprisingly it has been shown that cleaning the surface, carried out in conventional fashion with the help of ionized argon, can be still further improved by means of pre-treatment according to the invention.

The metal coating applied to the surface consists preferably of at least 75 weight percent of aluminum. Especially preferred is a metal coating that consists entirely of aluminum.

The thickness of the applied metal coating can be enhanced during the coating process. This is carried out preferably in another mechanical stage that can consist in particular of blasting the surface of the sintered body with glass spheres or beads.

After the coating has been applied, corrosion resistance can be improved by a conventional heat treatment. A preferred, suitable heat treatment is carried out at a temperature of at least 400° C. The duration of the heat treatment is preferably at least 30 minutes. It can usefully be carried out in an atmosphere of air, in vacuum or under a protective gas.

The method according to the invention enables the production of magnetic bodies with improved corrosion-inhibiting properties. In addition the invention relates to a magnetic body containing rare earth metals with a corrosion-inhibiting coating consisting essentially of a metal applied to its surface. Magnetic bodies according to the invention are specially characterized in that corrosion resistance measured according to the HAST test is at least 50 hours, preferably 150 hours, for a coating thickness of less than 40 μm where the HAST test is carried out in a saturated water vapor atmosphere at a temperature of 130° C. and a pressure of 2.7 bar and the test is considered satisfactory if within the above-mentioned period no appearance of corrosion such as blistering or delamination of the coating occurs.

The thickness of the corrosion-inhibiting coating on the magnetic body lies preferably in a range below 25 μm. The preferred lower limit for the thickness of the coating is 1 μm.

The corrosion-inhibiting coating on the magnetic body according to the invention consists preferably of at least 75 weight percent of aluminum.

Corrosion protection of coating according to the invention is surprisingly high, exceeding the results of conventional coatings. For many applications just a single corrosion-inhibiting coating is entirely sufficient. Hence sintered materials with just a single corrosion-inhibiting coating on the surface of the magnetic body are preferred.

The metallic surface of the corrosion-inhibiting coating is preferably chromated.

According to the invention all materials conventionally utilized for the production of magnetic bodies can be employed as material for the magnetic body or as sintered material. The material consists preferably essentially of RE—Fe—B where RE represents at least one rare earth element including Y.

A particularly preferred material for the magnetic body consists of 8 to 30 atomic percent rare earth and 2 to 28 atomic percent boron with the remainder iron.

The following construction examples serve to explain the invention.

EXAMPLE 1

6 kgs of bar magnets were produced by sintering from Nd—Fe—B and cut to a size of 20×6×2 mm. The bar magnets were placed in a 7 liter galvanizing drum and stripped in 10% nitric acid for 60 seconds at a rotation rate of 15 rpm. The magnets were subsequently rinsed three times with tap water, then rinsed twice with deionized water.

After rinsing the parts were rinsed 3 times in γ-butyrolactone to passivate the surface. This completely removes water from the body of the material to passivate it so as to prevent corrosion of the parts during drying. Drying was carried out directly in the solvent-wetted condition in a centrifuge at a temperature of 80° C. and a rotation rate of 500 rpm. The magnetic parts thus obtained displayed no signs of surface dust or corrosion.

Finally the magnetic parts were coated with aluminum in an IVD chamber using a drum method. The coating process produced a coating thickness of 5 to 15 μm. The thickness of the aluminum coating applied in the final stage was enhanced with the aid of glass bead blasting.

10 of the magnetic parts produced by the present example were subjected to a saturated water vapor atmosphere at a temperature of 130° C. and a pressure of 2.7 bar for 72 hours (HAST test). After the test the magnetic parts were visually examined.

None of the 10 magnetic parts displayed surface peeling or delamination.

EXAMPLE 2

The aluminum coating process was followed as in Example 1 with the following exceptions: after rinsing with water the parts were immediately immersed in a dewatering fluid, for example Safecoat® from Castrol Corp., which displaces water on the parts. The magnetic parts thus wetted with dewatering fluid were then dried and coated with aluminum as in Example 1.

10 of the magnetic parts were subjected to the HAST test and then visually inspected as in Example 1.

None of the 10 magnetic parts displayed surface peeling or delamination.

EXAMPLE 3

Production of the magnetic parts was followed as in Example 1 with the following exceptions: after rinsing with water the parts were immediately immersed for 60 seconds in an aqueous solution containing a commercial chromic acid (Citrin 106® yellow chromate from Kampschulte Corp.). The parts were then rinsed 3 times with tap water and twice with deionized water. 10 of these magnetic parts were subjected to the HAST test as in Examples 1 and 2 and then visually inspected. None of the 10 magnetic parts displayed surface peeling or delamination.

EXAMPLE 4 (COMPARISON)

6 kgs of bar magnets made from Nd—Fe—B were surface-activated by blasting with corundum. The magnetic parts were then air-blasted using oil-free compressed air. In contrast to the preceding examples, the parts were placed in the IVD coating chamber and coated immediately, that is within 30 minutes, following activation of the surface.

10 of these magnetic parts were subjected to the HAST test as in Examples 1 through 3 and then visually inspected.

After 24 hours 3 of the 10 magnetic parts produced as in Example 4 already displayed extensive surface peeling or delamination. After 48 hours the remaining 7 pieces already displayed extensive surface peeling or delamination.

EXAMPLE 5

10 magnetic parts produced as in Example 1 were subjected after coating to the treatment method described in EP-A-O 794268 for 2 hours in air at a temperature of 500° C.

Magnets produced with this method displayed a corrosion resistance of 150 hours measured after the HAST test at 130° C. and a pressure of 2.7 bar.

The construction examples show that magnetic parts produced according to the invention Examples 1 through 3) withstand the HAST test for at least 72 hours. Subsequent heat treatment increases the corrosion resistance of the magnetic parts to at least 150 hours measured after the HAST test. Magnetic parts produced according to current technology (Example 4) do not meet these requirements.

What is claimed is:

1. Method for producing a sintered material offering improved corrosion protection by activation of the surface and subsequent coating of said surface with a metal followed by a heat treatment, in which during activation and before coating with said metal the following steps are carried out:

removal of particles adhering to the surface of the sintered material by treating said surface with a stripper comprising an aqueous solution;

passivation of said surface by means of at least one step from the group
   (a) treating the surface with hydrophilic solvent,
   (b) treating the surface with phosphating solution,
   (c) treating the surface with chromating solution,
   (d) treating the surface with dewatering fluid or
   (e) heat-treating the sintered material and drying the sintered material.

2. The method as in claim 1, specially characterized in that the sintered material is not cleaned of impurities by means of a device for mechanical abrasion such as blasting with sand or corundum prior to coating.

3. The method as in claim 1, specially characterized in that the stripper contains an acid.

4. The method as in claim 1, specially characterized in that the stripper consists of a solution with an acid content in a range from 0.2 to 25 weight percent.

5. The method as in claim 1, in which passivation of the sintered material is carried out by means of a chromating solution, a dewatering fluid or a water-mixable solvent.

6. The method as in claim 1, specially characterized in that the metal coating applied to the surface contains at least 75 weight percent of aluminum.

7. The method as in claim 1, specially characterized in that the metal coating is applied to the surface using a physical vapor deposition (PVD) process.

8. The method as in claim 1, specially characterized in that the thickness of the applied metal coating is enhanced by glass bead blasting.

9. The method as in claim 1, specially characterized in that subsequent to coating a heat treatment is carried out at a temperature greater than 400° C. for a period of at least 30 minutes.

\* \* \* \* \*